(12) United States Patent
Wu

(10) Patent No.: US 12,166,440 B2
(45) Date of Patent: Dec. 10, 2024

(54) CURRENT MONITORING AND CIRCUIT TEMPERATURE MEASUREMENTS

(71) Applicant: Infineon Technologies Austria AG, Villach (AT)

(72) Inventor: Wei Wu, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 173 days.

(21) Appl. No.: 18/075,711

(22) Filed: Dec. 6, 2022

(65) Prior Publication Data

US 2024/0186927 A1 Jun. 6, 2024

(51) Int. Cl.
*H02P 21/22* (2016.01)
*H02P 21/14* (2016.01)

(52) U.S. Cl.
CPC .............. *H02P 21/22* (2016.02); *H02P 21/14* (2013.01)

(58) Field of Classification Search
CPC .. G01R 19/0092; G01R 1/203; G01R 19/003; G01R 35/00; G01R 31/2621; H02M 1/0009; H02M 7/537; H02M 1/327; H02P 6/12; H02P 27/08; H02P 21/22; H02P 25/022; H02P 29/40; H02P 25/03; H02P 6/15; H02P 6/14; H02P 2207/05; H02P 6/28; H02P 21/14; H02P 27/06; H02P 6/32; H02P 25/22; H02P 29/60; H02P 29/68; H02P 29/64
See application file for complete search history.

(56) References Cited

U.S. PATENT DOCUMENTS

2021/0172983 A1* 6/2021 Costanzo .......... H02M 7/53871

FOREIGN PATENT DOCUMENTS

| KR | 20160104774 A | 9/2016 |
| KR | 20210141270 A | 11/2021 |

OTHER PUBLICATIONS

Extended Search Report, EP 23 21 1229, Apr. 3, 2024, pp. 1-21.

* cited by examiner

*Primary Examiner* — Antony M Paul
(74) *Attorney, Agent, or Firm* — Armis IP Law, LLC

(57) ABSTRACT

An apparatus includes a controller that measures a first voltage across a first circuit path including a series connection of a first switch and a shunt resistor. The first voltage generated based on first current supplied from a first winding of a motor including multiple windings. Based on the magnitude of the first voltage, the controller determines an ON-resistance of the first switch. The ON-resistance can be used final office action any suitable purpose. For example, the controller can be configured to use the determined ON-resistance of the first switch to controller operation of a motor including the first winding. For example, the determined ON-resistance can be used as a basis to determine an amount of current through first switch and corresponding first winding of the motor.

23 Claims, 9 Drawing Sheets

ADC SAMPLING OPTION 1

$SV = -Iv * Rv$
$SW' = (SW1 + SW2) * 0.5 = -Iw * Rw - Iw * RS$
$SW = -Iw * Rw$ $Iv = -Sv / Rv$
$Iw = -SW / Rw$
$Iu = -Iv - Iw$
$Rw = SW * RS / (SW' - SW)$

ADC SAMPLING OPTION 2

$SU = -Iu * Ru$
$SV' = (SV1 + SV2) * 0.5 = -Iv * Rv + Iu * RS$
$SV = -Iv * Rv$ $Iu = -SU / Ru$
$Iv = -SV / Rv$
$Iw = -Iu - Iv$
$Ru = SU * RS / (SV - SV')$

ADC SAMPLING OPTION 3

$SU = -Iu * Ru$
$SW' = (SW1 + SW4) * 0.5 = -Iw * Rw + Iu * RS$
$SW'' = (SW2 + SW3) * 0.5 = -Iw * Rw - Iw * RS$
$SW = -Iw * Rw$ $Iu = -SU / Ru$
$Iw = -SW / Rw$
$Iv = -Iu - Iw$
$Rw = SW * RS / (SW'' - SW)$
$Ru = SU * RS / (SW - SW')$

CURRENT MONITORING AND CIRCUIT TEMPERATURE MEASUREMENTS

BACKGROUND

Shunt current sensing is a simple, relatively inexpensive and widely used technique in digital motor control such as in, for example, power tool applications. To reduce the power dissipation at high current sensing, the shunt resistance value typically is sized to be very small (e.g., less than 0.5 milliohms [0.5 mΩ]), which makes it challenging for accurate current sensing over a wide current range, especially when the current is small at low speed or light load.

Thus, in a conventional motor driver system, it's common to use a shunt resistor to sense motor winding current. There are two more specific conventional solutions such as: i) three shunt resistors, one on each winding phase, there is one shunt resistor placed in serial with low side MOSFET, and ii) a single shunt in which the shunt resistor is place in serial with DC link.

Each solution has pros and cons. Three shunts is easy to implement but it takes up more printed circuit board space, requires higher hardware cost, and results in more power losses. The conventional single shunt solution needs complicated algorithm and more difficult to control when the PWM duty cycle is low.

A field effect transistor such as a MOSFET has an Rdson value which potentially can be used to sense current. The ON-resistance of the field effect transistor is the resistance between the drain node and the source node when the switch is activated to the ON-state.

BRIEF DESCRIPTION

This disclosure includes the observation that conventional techniques of monitoring current through a motor winding and determination of an Rds(on) of same suffer from deficiencies.

The main challenges of Rdson current sensing are:
1. Rdson is changing by MOSFET junction temperature. In theory, we could use on-board temperature sensor to compensate Rdson change. But in reality, it's not feasible because respective temperature sensor hardware is typically very slow; that is, it doesn't reflect immediate MOSFET junction temperature. Additionally, the placement of on-board temperature sensor may cause big steady state temperature errors.
2. When MOSFET is off, the voltage across the device (Vds) is too high for op-amp or MCU's ADC input. Accordingly, there is a need for some hardware to limit the signal amplitude when MOSFET is off.

As discussed herein, combining single shunt and Rdson sensing into one solution provides:
  Motor current information, which is available on both shunt resistor and Rdson sensing
  Rdson current current sensing is the primary method of motor current sensing, because it can be done on each motor phase
  Single shunt current is also sensed, the signal is mainly used to calculate MOSFET Rdson, so that we can compensate Rdson current sensing, and meantime we can calculate MOSFET junction temperature As discussed herein, motor controller is configured to determine the real-time junction temperature of individual MOSFET by Rdson measure, helping to improve motor drive system reliability. Such techniques also allow a customer to design motor drive with higher short-time current rating.

This disclosure includes novel ways of determining attributes of a field effect transistor such as an Rdson of the field effect transistor.

For example, an apparatus a controller operative to: monitor a first voltage across a first circuit path including a series connection of a first switch and a shunt resistor, the first voltage across the first circuit path generated based on first current supplied from a first winding of a motor through the first circuit path; and based on the monitored first voltage, determine an ON-resistance of the first switch.

The controller may monitor a second voltage across a second circuit path including a series connection of a second switch and the shunt resistor, the second voltage generated based on second current supplied from a second winding of the motor. The controller, based on the monitored first voltage and the monitored second voltage, may determine an ON-resistance of the second switch. The first winding and the second winding of the motor may be connected in series.

The controller may utilize the determined ON-resistance of the first switch to control operation of the motor.

The controller may map a magnitude of the ON-resistance of the first switch to a temperature value indicative of a temperature of the first switch. The controller may control operation of the first switch based on the temperature of the first switch.

The controller may determine a magnitude of the first current through the first winding based on a sample magnitude of the first voltage across the first circuit path.

The first switch may be a low-side switch disposed in series with a high-side switch, the low-side switch operative to control current through the first winding.

The first voltage may be measured during a condition in which the first switch is set to an ON-state.

The controller may be operative to: obtain a sample of a magnitude of the first voltage during a condition in which a magnitude of current through the shunt resistor is substantially zero; and determine the ON resistance of the first switch based on the sample.

The first switch may be a field effect transistor. The ON-resistance of the first switch may be an RDS ON-resistance of the field effect transistor.

The controller may be further operative to: produce a first sample (SW) of the first voltage during a first condition in which the first switch is activated to an ON-state; produce a second sample (SW1) of the first voltage during a second condition in which the first switch is activated to the ON-state; receive a resistance of the shunt resistor; and determine the ON-resistance of the first switch based on the first sample (SW), the second sample (SW1), and the resistance of the shunt resistor.

A magnitude of current through the shunt resistor may be is substantially zero during the first condition; and the magnitude of current through the shunt resistor may be substantially non-zero during the second condition.

The controller may be further operative to: produce a first sample (SW) of the first voltage during a first condition in which the first switch is activated to an ON-state; produce a second sample (SW1) of the first voltage during the first condition in which the first switch is activated to the ON-state; produce a third sample (SW2) of the first voltage during the first condition in which the first switch is activated to the ON-state; receive a resistance of the shunt resistor; and determine the ON-resistance of the first switch based on the first sample (SW), the second sample (SW1), the third sample (SW2), and the resistance of the shunt resistor; wherein the ON-resistance of the first switch is equal to Rw; wherein a resistance of the shunt resistor is RS; and wherein SW'=(SW1+SW2)*0.5; and wherein Rw=SW*RS/(SW'−SW)*RS. Note that SW may be sampled at the middle of SW1 and SW2, it can be assumed that phase current at the sample time SW equals an average phase current at sample time SW1 and SW2.

The controller may be further operative to monitor a second voltage across a second circuit path including a second series connection of a second switch and the shunt resistor, the second voltage generated based on second current supplied from a second winding of the motor; and determine the ON-resistance of the first switch based on the monitored first voltage and the monitored second voltage.

The controller may be further operative to: produce a first sample (SU) of the first voltage during a first condition in which both the first switch and the second switch are activated to an ON-state; produce a second sample (SV) of the second voltage during the first condition in which both the first switch and the second switch are activated to the ON-state; produce a third sample (SV1) of the second voltage during a second condition in which the first switch is deactivated to an OFF-state and the second switch is activated to an ON-state; and produce a fourth sample (SV2) of the second voltage during a second condition in which the first switch is deactivated to an OFF-state and the second switch is activated to an ON-state; and determine the ON-resistance of the first switch based on the first sample (SU), the second sample (SV), the third sample (SV1), the fourth sample (SV2) and a resistance of the shunt resistor.

A magnitude of current through the shunt resistor may be substantially zero during the first condition; the magnitude of current through the shunt resistor is substantially non-zero during the second condition. The ON-resistance of the first switch is equal to Ru; wherein a resistance of the shunt resistor is RS; wherein SV'=(SV1+SV2)*0.5; and wherein Ru=SU*RS/(SV'−SV).

The controller may be further operative to: monitor a second voltage across a second circuit path including a second series connection of a second switch and the shunt resistor, the second voltage generated based on second current supplied from a second winding of the motor; produce a first sample (SU) of the first voltage during a first condition in which both the first switch and the second switch are activated to an ON-state; and produce a second sample (SW) of the second voltage during the first condition in which both the first switch and the second switch are activated to the ON-state; produce a third sample (SW1) of the second voltage during a second condition in which the first switch is deactivated to an OFF-state and the second switch is activated to an ON-state; produce a third sample (SW4) of the second voltage during the second condition in which the first switch is deactivated to an OFF-state and the second switch is activated to an ON-state; and determine the ON-resistance of the second switch based on the first sample (SU), the second sample (SW), the third sample (SW1), and the fourth sample (SW4), and a resistance of the shunt resistor.

The ON-resistance of the second switch is equal to Ru; wherein a resistance of the shunt resistor is RS; wherein SW'=(SW1+SW4)*0.5; and wherein Ru=SU*RS/(SW'−SW).

Note that, this disclosure shows sensing current on two phases within a PWM cycle; a third phase may not be sensed because the sum of three phase currents is always 0. It is possible implement current sensing all phases such as including a third phase as well. This may be beneficial in an ADC in the MCU that user chooses might be sufficiently fast and capable of performing analog sampling for three or more inputs at a time, in which case the user can assign analog input of each phase to dedicated ADC sampling channel. This ADC configuration may remain unchanged while motor is running; the executed controller (such as executed) software can be configured to pick two of the three sample results depending on PWM sector.

As previously discussed, the techniques herein are useful over conventional techniques. Examples herein include determining an ON-resistance of one or more instances of low side switch circuitry as well as corresponding one or more temperatures of same. The techniques as discussed herein can be used for any suitable purpose. For example, techniques herein may include improving an accuracy of determining a temperature of one or more switches driving a motor. For example, examples herein implement novel techniques to measure a parameter such as an Rds(ON) of one or more switches; the detected Rds(ON) value can be mapped to a temperature value indicative of the drain source junction in a field effect transistor. Additionally, or alternatively, the detected ON-resistance of the one or more switches can be used as part of a shunt resistor to measure a current through one or more of the motor windings.

These and other more specific examples are disclosed in more detail below.

Note that although examples as discussed herein are applicable to current monitoring and motor control, the concepts disclosed herein may be advantageously applied in any suitable application.

Note further that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different operations.

Yet other examples herein include software programs to perform the steps and operations summarized above and disclosed in detail below. One such example comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, examples herein are directed to methods, systems, computer program products, etc., that support operations as discussed herein.

One example herein includes a computer readable storage medium and/or system having instructions stored thereon. The instructions, when executed by computer processor hardware, cause the computer processor hardware (such as one or more co-located or disparately located processor devices) to: measure (sample) a first voltage across a first circuit path including a series connection of a first switch and a shunt resistor, the first voltage generated based on first current supplied from a first winding of a motor including multiple windings; based on the samples of the first voltage and corresponding magnitudes, determine an ON-resistance of the first switch; and utilize the determined ON-resistance of the first switch to control operation of the motor.

One example herein includes a computer readable storage medium and/or system having instructions stored thereon. The instructions, when executed by computer processor hardware, cause the computer processor hardware (such as one or more co-located or disparately located processor devices) to: monitor a first voltage across a first circuit path including a first series connection of a first switch and a shunt resistor, the first voltage generated based on first current supplied from a first winding of a motor; monitor a second voltage across a second circuit path including a series connection of a second switch and the shunt resistor, the second voltage generated based on second current supplied from a second winding of the motor; based on the monitored first voltage, determine an ON-resistance of the first switch; and based on the monitored first voltage and the monitored second voltage, determine an ON-resistance of the second switch.

The ordering of the steps above has been added for clarity sake. Note that any of the processing operations as discussed herein can be performed in any suitable order.

Other examples of the present disclosure include software programs and/or respective hardware to perform any of the method example steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing different gain control implementations to deliver current to a load such as a motor winding that supplies torque. However, it should be noted that examples herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of examples herein (BRIEF DESCRIPTION) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

Figure 1:
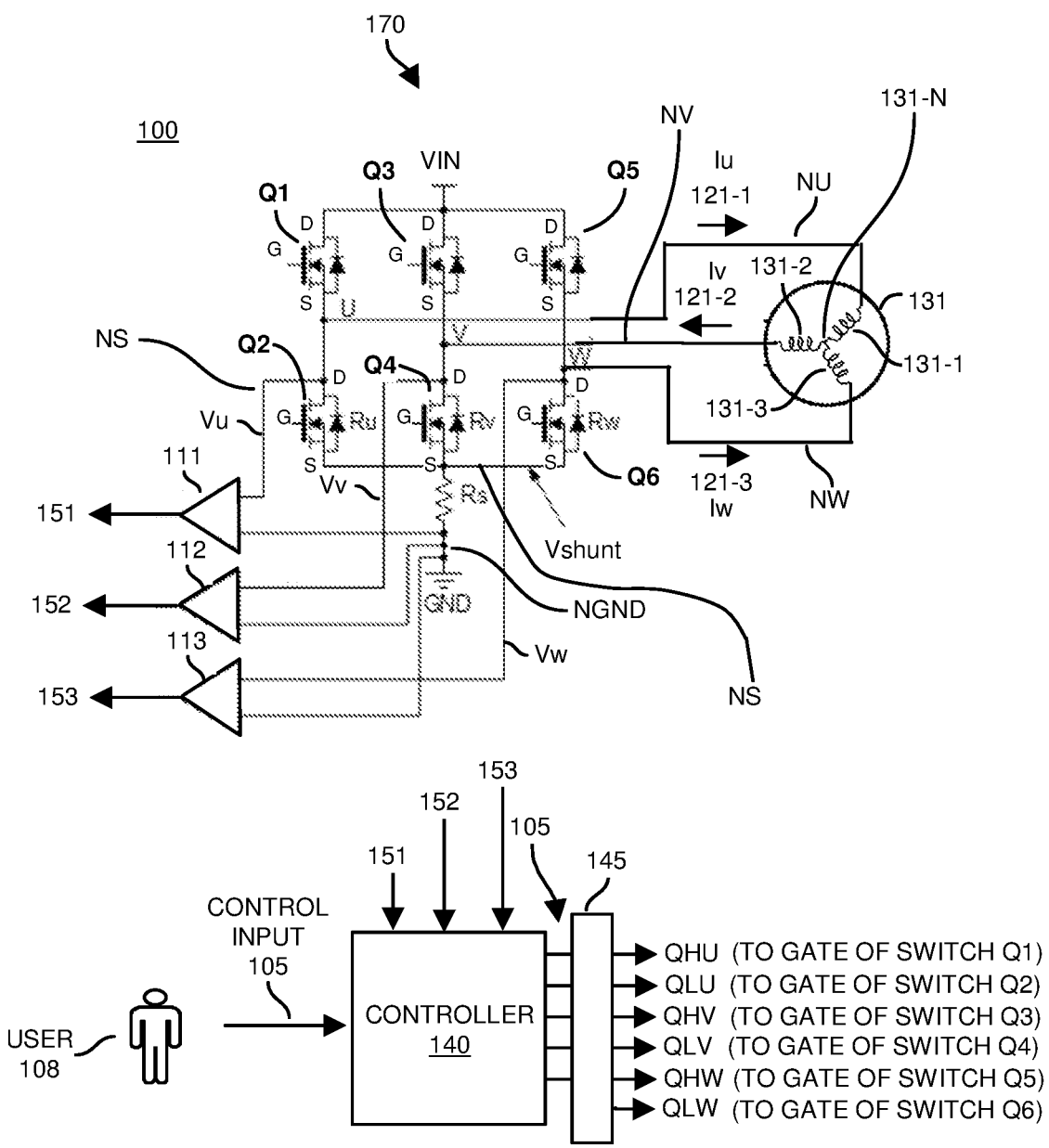
FIG. 1 is an example general diagram of a voltage/current monitoring and control system as discussed herein.

The foregoing and other objects, features, and advantages of the invention will be apparent from the following more particular description of preferred examples herein, as illustrated in the accompanying drawings in which like reference characters refer to the same parts throughout the different views. The drawings are not necessarily to scale, with emphasis instead being placed upon illustrating the examples, principles, concepts, etc.

DETAILED DESCRIPTION

An apparatus includes a controller that monitors and measures a first voltage across a first circuit path including a series connection of a first switch and a shunt resistor. The first voltage is generated based on first current supplied from a first winding of a motor including multiple windings. In other words, the current through the winding passes through the series circuit path. Based on the magnitude of the first voltage, the controller determines an ON-resistance of the first switch.

The controller then uses the determined ON-resistance of the first switch to controller operation of a motor including the first winding. For example, the determined ON-resistance can be used as a basis to determine an amount of current through the first winding of the motor. Additionally, or alternatively, the ON-resistance of the first switch can be used to determine a first temperature of the first switch and/or corresponding drain source junction of the first switch.

Now, more specifically, FIG. 1 is an example general diagram of a voltage/current monitoring and control system as discussed herein.

As shown, the motor monitoring and control system 100 (motor system or other suitable type system including one or more windings) includes controller 140 that controls operation of the motor 131. The motor 131 can be configured to include any number of windings. In this non-limiting example, motor 131 includes multiple windings such as winding 131-1, winding 131-2, and winding 131-3.

Motor 131 can be any type of motor and include any number of windings. For example, motor 131 can be PMSM (Permanent Magnet Synchronous Motor), BLDC (Brushless DC Motor), ACIM (AC Induction Motor) motor, etc.

Further, one end of each of the windings of motor 131 is connected to a respective common node 131-N. For example, the winding 131-1 is connected between the node NU and the common node NC; the winding 131-2 is connected between the node NV and the common node 131-N; the winding 131-3 is connected between the node NW and the common node 131-N.

The inverter 170 can be configured to include one or more switches. The switches in inverter 170 can be any suitable type such as MOSFETs (Metal Oxide Semiconductor Field Effect Transistors), IGBT (Insulated-Gate Bipolar Transistor), BJT (Bipolar Junction Transistors), etc.

The inverter 170 includes multiple pairs of switches connected in series.

For example, inverter 170 includes a series connection of switch Q1 such as high side switch circuitry and switch Q2 such as low side switch circuitry and shunt resistor Rs. More specifically, the drain node of switch Q1 is connected to the input voltage Vin; the source node of the switch Q1 is connected to the drain node of switch Q2; the source node of the switch Q2 is connected to the shunt node NS; the shunt resistor is connected between the shunt node NS and the ground node NGND (ground potential).

Activation/deactivation of switches Q1 and Q2 controls current 121-1 through the winding 131-1. Switches Q1 and Q2 are never activated at the same time.

As further shown, inverter 170 includes a series connection of switch Q3 such as high side switch circuitry and switch Q4 such as low side switch circuitry and shunt resistor Rs. Note that the shunt resistor Rs can be a static resistor set to 0.5 milliohms or other suitable value. More specifically, the drain node of switch Q3 is connected to the input voltage Vin; the source node of the switch Q3 is connected to the drain node of switch Q4; the source node of the switch Q4 is connected to the shunt node NS; the shunt resistor Rs is connected between the shunt node NS and the ground node NGND (ground potential). Activation/deactivation of switches Q3 and Q4 controls current 121-2 through the winding 131-2. Switches Q3 and Q4 are never activated at the same time.

As further shown, inverter 170 includes a series connection of switch Q5 such as high side switch circuitry and switch Q6 such as low side switch circuitry and shunt resistor Rs. More specifically, the drain node of switch Q5 is connected to the input voltage Vin; the source node of the switch Q5 is connected to the drain node of switch Q6; the source node of the switch Q6 is connected to the shunt node NS; the shunt resistor Rs is connected between the shunt node NS and the ground node NGND (ground potential). Activation/deactivation of switches Q5 and Q6 controls current 121-3 through the winding 131-3. Switches Q5 and Q6 are never activated at the same time.

Controller 140 can be configured to further include signal generator 145 and inverter 170 (such as switch circuitry) to drive each of the switches in the inverter 170, controlling respective current 121-1, 121-2, and 121-3 through windings 131-1, 131-2, and 131-3 associated with the motor 131.

For example, the controller 140 receives respective control input 105 from the user 108. Based on the control input 105, such as one or more signals indicating how to control operation (such as shaft speed, torque, etc.) of the motor 131, the controller 140 operates the signal generator 145 to produce control signals 105. Appropriate timing of control signals 105 controls operation of respective switches in the inverter 170 and variation in the magnitudes of current 121-1, 121-2, and 121-3, through respective windings 131-1, 131-2, and 131-3, resulting a corresponding rotation of a shaft of the motor 131 at a desired angular amount.

More specifically, the controller 140 and corresponding signal generator 145 produce control signal QHU to drive the gate node (G) of switch Q1; the controller 140 and corresponding signal generator 145 produce control signal QLU to drive the gate node (G) of switch Q2; the controller 140 and corresponding signal generator 145 produce control signal QHV to drive the gate node (G) of switch Q3; the controller 140 and corresponding signal generator 145 produce control signal QLV to drive the gate node (G) of switch Q4; the controller 140 and corresponding signal generator 145 produce control signal QHW to drive the gate node (G) of switch Q5; the controller 140 and corresponding signal generator 145 produce control signal QLW to drive the gate node (G) of switch Q6.

Thus, the controller 140 may receive control input 105 indicating how to control operation of motor 131. In accordance with the control input 104, the controller 140 controls a corresponding flow of current 121-1, 121-2, and 121-3 through respective windings 131-1, 131-2, and 131-3 of the motor 131. According to one implementation as further discussed herein, via generation of control signals 105 (such as pulse width modulation signals), the controller 140 balances positive demagnetization and negative demagnetization of each of the multiple windings in a respective control cycle.

As further discussed herein, the controller 140 can be configured to monitor one or more voltages Vu, Vv, Vw, at different times to determine a parameter such as the so-called ON-resistance (i.e., resistance of each of switches between drain and source node when the switch is activated to an ON-state) of each of the switches at different times. Knowing the ON-resistance is useful as it can be used to determine a magnitude of current flowing through a respective winding of the motor 131 as well as a temperature of the switches.

As previously discussed, the inverter 170 includes a first series circuit path including switch Q2 and shunt resistor Rs connected between node NU and NGND; the inverter 170 includes a second series circuit path including switch Q4 and shunt resistor Rs connected between node NV and NGND; and inverter 170 includes a third series circuit path including switch Q6 and shunt resistor Rs connected between node NW and NGND.

Note further that the controller is configured to monitor the voltages Vu, Vv, and Vw (and corresponding series circuit paths such as first circuit path including switch Q2 and shunt resistor RS, second circuit path including switch Q4 and shunt resistor RS, and third circuit path including switch Q6 and shunt resistor RS,) based on implementation of amplifier circuit 111 and the, amplifier circuit 112, and amplifier circuit 113.

The amplifier 111 amplifies the respective voltage Vu between the node NU and the ground reference NGND to produce the voltage signal 151. Thus, the voltage signal 151 indicates a magnitude of the voltage Vu.

The amplifier 112 amplifies the respective voltage Vv between the node NV and the ground reference NGND to produce the voltage signal 152. Thus, the voltage signal 152 indicates a magnitude of the voltage Vv.

The amplifier 113 amplifies the respective voltage Vw between the node NW and the ground reference NGND to produce the voltage signal 153. Thus, the voltage signal 153 indicates a magnitude of the voltage Vw.

As further discussed herein, typically, the controller 140 monitors and samples respective voltages Vu, Vv, and Vw via monitoring of remote control device voltage signals 151, 152, and 153.

As previously discussed, motor 130 includes three windings such as motor winding 131-1, motor winding 131-2, and motor winding 131-3. At any time, the sum of current 121-1, 121-2, and 121-3 through all windings 131-1, 131-2, and 131-3 is zero. Hence, if a magnitude of currents through two windings is known, the current in the third winding can be determined from the first two known magnitudes of current. Note further that when all three switches Q2, Q4, and Q6 are activated at the same time, the amount of current through the shunt resistor Rs is equal to 0. However, different current may flow through each of the windings.

As previously discussed, nodes of all three windings 131-1, 131-2, and 131-3 are connected together at a common node NC of the motor 131.

Yet further, as previously discussed, via generation of the control signals 105, the pulse width modulation generator 145 produces control signals such as QHU, QLU, QHV, QLV, QHW, and QLW applied to respective switches Q1-Q6 to control an amount of current through the windings. For example, based on control signals 105, the signal generator 145 produces control signals QHU, QLU, QHV, QLV, QHW, and QLW.

Figure 2:
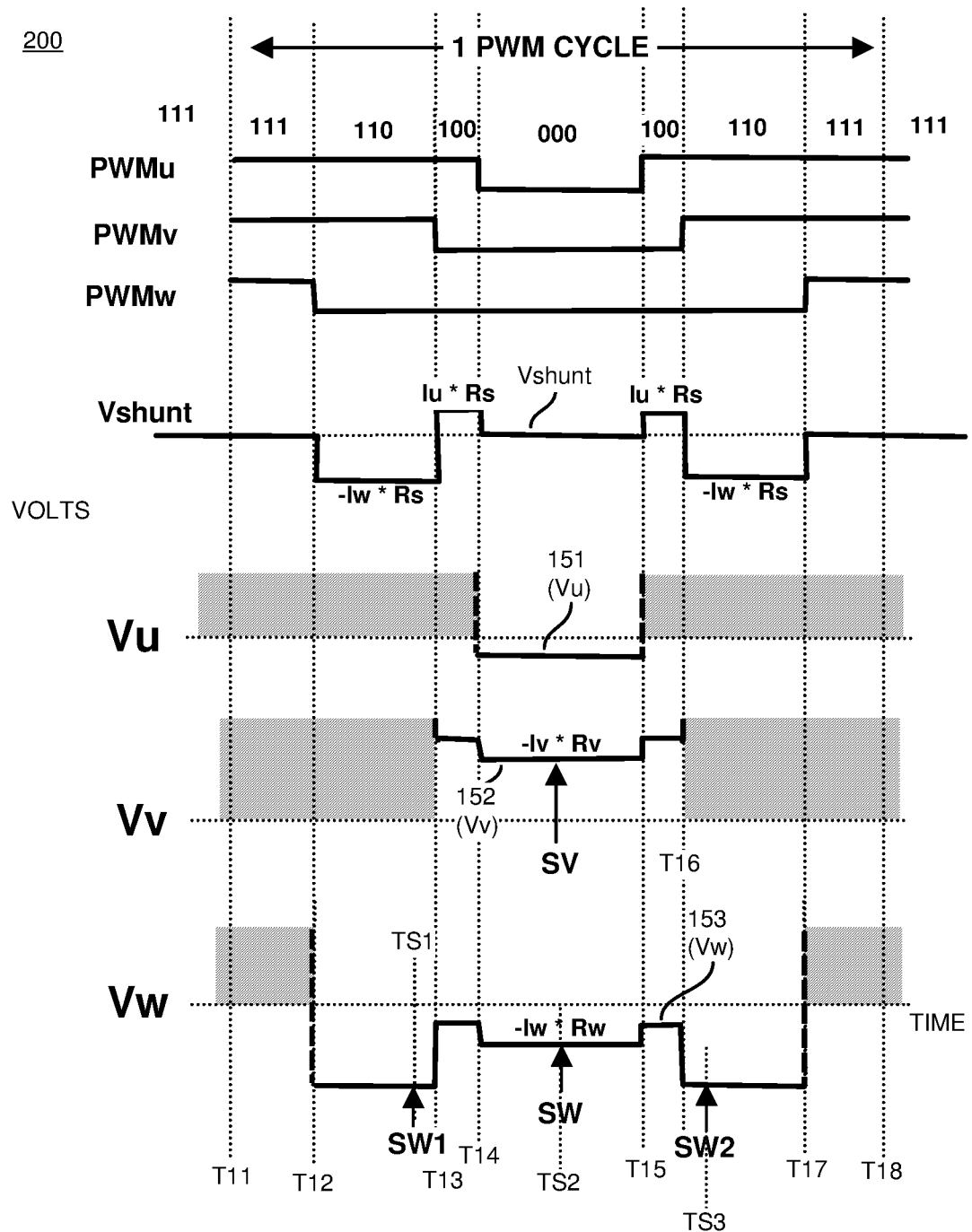
FIG. 2 is an example diagram illustrating voltage sampling and determination of an ON-resistance of a switch as discussed herein.
Figure 3:
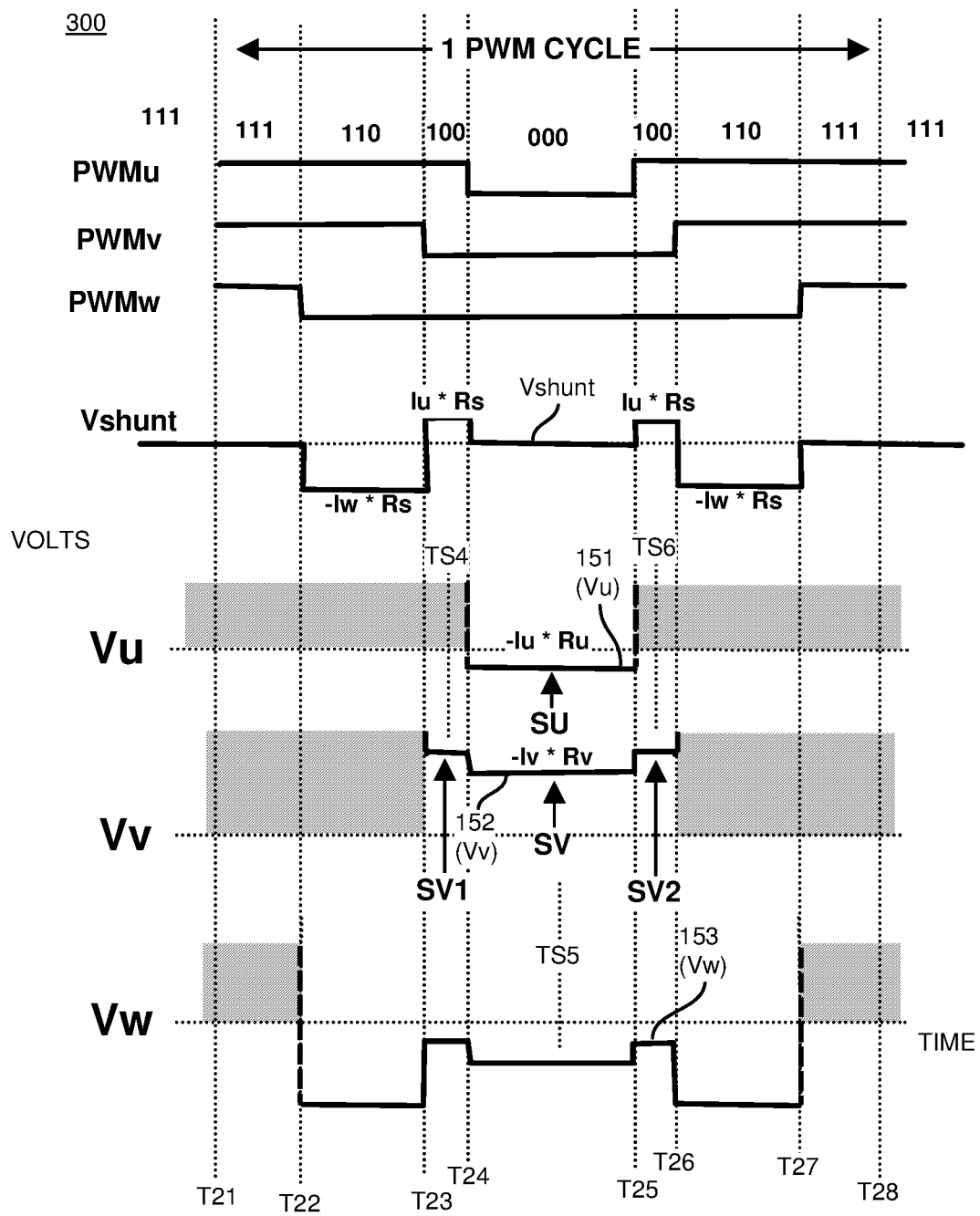
FIG. 3 is an example diagram illustrating voltage sampling and determination of an ON-resistance of a switch as discussed herein.
Figure 4:
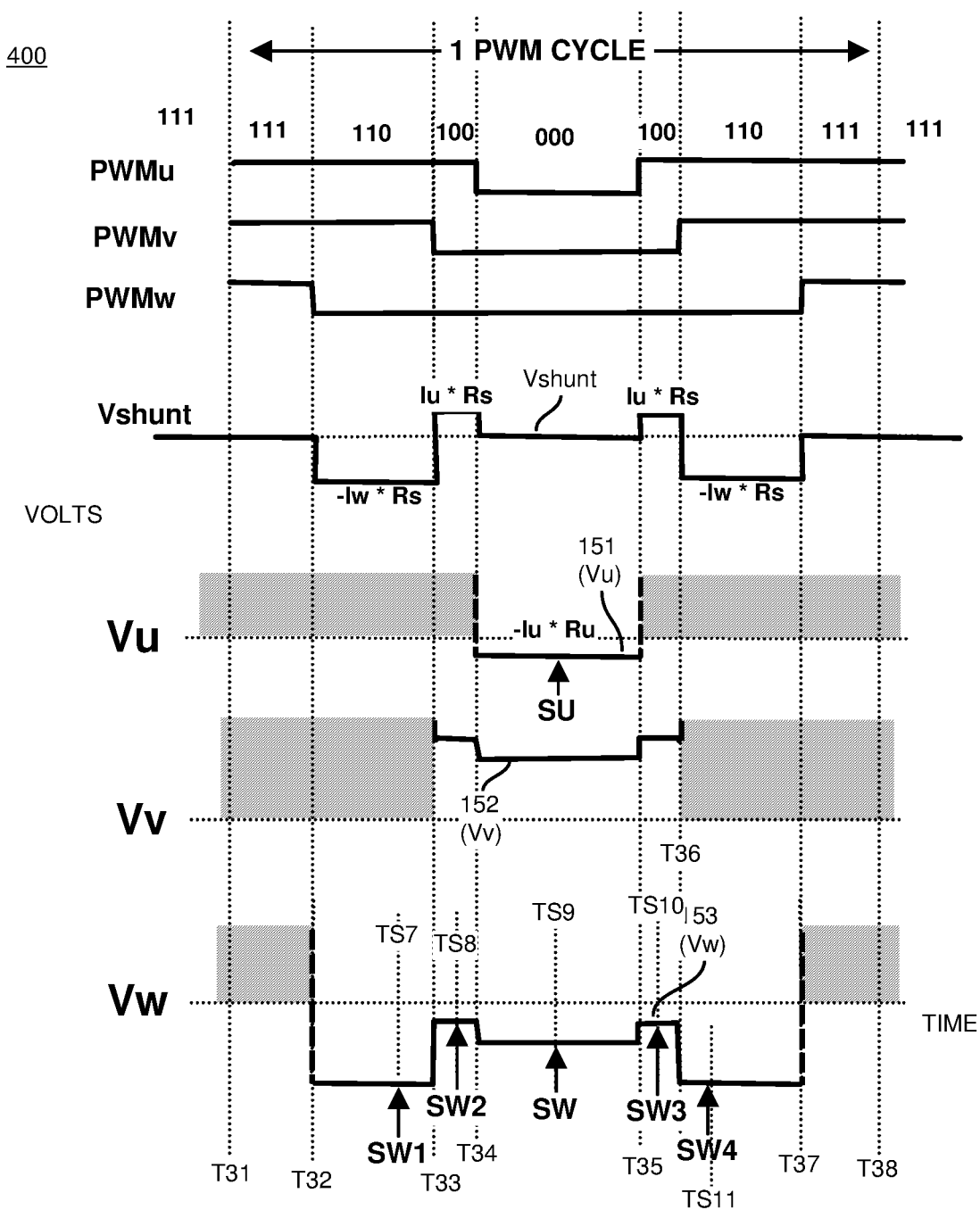
FIG. 4 is an example diagram illustrating voltage sampling and determination of an ON-resistance of a first switch and a second switch as discussed herein.

Examples of pulse width modulation controls signals (such as QHU, QLU, QHV, QLV, QHW, QLW) driving respective gate nodes of the switches of inverter 170 are shown in FIGS. 2, 3, and 4.

FIG. 2 is an example diagram illustrating voltage sampling and determination of an ON-resistance of a switch as discussed herein.

In this example, the timing diagram 200 indicates states of respective switches of the inverter 170 during different portions of a pulse width modulation cycle. The time between T11 and time T18 is one pulse width modulation cycle.

PWMu indicates states of controlling switches Q1 and Q2. For example, a high state of PWMu indicates the switch Q1 is ON and switch Q2 is OFF; a low state of PWMu indicates that the switch Q1 is OFF and switch Q2 is ON.

PWMv indicates states of controlling switches Q3 and Q4. A high state of PWMv indicates the switch Q3 is ON and switch Q4 is OFF; a low state of PWMv indicates that the switch Q3 is OFF and switch Q4 is ON.

PWMw indicates states of controlling switches Q5 and Q6. A high state of PWMw indicates that the switch Q5 is ON and switch Q6 is OFF; a low state of PWMw indicates that the switch Q5 is OFF and switch Q6 is ON.

Thus, as shown, between time T11 and time T12 (sequence 111), as indicated by signals PWMu, PWMv, and PWMw, the controller 170 activates switches Q1, Q3, and Q5 to an on state while deactivating switches Q2, Q4, and Q6 to an OFF-state.

Between time T12 and time T13 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T13 and time T14 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T14 and time T15 (sequence 000), as indicated by signals PWMu, PWMv, and PWMw, the controller 170 activates switches Q2, Q4, and Q6 to an ON state while deactivating switches Q1, Q3, and Q5 to an OFF-state.

Between time T15 and time T16 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T16 and time T17 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T17 and time T18 (sequence 111), as indicated by signals PWMu, PWMv, and PWMw, the controller 170 activates switches Q1, Q3, and Q5 to an on state while deactivating switches Q2, Q4, and Q6 to an OFF-state.

As further discussed herein, the controller 140 performs several measurements in one or more pulse width modulation control cycles of a sector to determine the magnitude of the Rds(ON) of a switch.

For example, to determine the ON-resistance of the switch Q6, the controller 140 monitors a magnitude of the voltage signal 153 representing a magnitude of the voltage Vw across the circuit path between node NW and node NGND to produce samples SW1, SW, and SW2.

As below, the controller 140 uses the collected samples in the equations below to produce a value for Rw (i.e., the ON-resistance between source and drain node of switch Q6).

$$SV=-Iv*Rv, \text{ where } Rv \text{ is the ON-resistance of the switch } Q4 =>>$$

thus $Iv=-SV/Rv$, $Iv$ is used for motor control;

$$SW=-Iw*Rw, \text{ where } Rw \text{ is the ON-resistance of the switch } Q6 =>>$$

thus $Iw=-SW/Rw$, $Iw$ is used for motor control;

$$SW'=-Iw*Rw-Iw*Rs=>>$$

thus $SW'=SW+[Sw/Rw]*RS;$ $$SW=-Iw*Rw=>> \text{thus } Iw=-SW/Rw;$$

$$SW'-SW=[Sw/Rw]*RS;$$

$$Rw=[SW*RS]/(SW'-SW).$$

$$Iu+Iv+Iw=0 \text{(based on Kirchoff's law) for motor control}=>>$$

$Iu=-Iv-Iw$, where $Iv$ and $Iw$ are known from above equations.

$$SV=-Iv*Rv$$

$$SW=(SW1+SW2)*0.5=-Iw*Rw-Iw*RS$$

$$SW=-Iw*Rw$$

$$Iv=-Sv/Rv$$

$$Iw=-SW/Rw$$

$$Iu=-Iv-Iw$$

$Rw=SW*RS/(SW'-SW)$, where $Rw$ is $Rds$ ON of the switch $Q6$, and $RS$ is a resistance of the shunt resistor $Rs$.

In this example, the controller 140 monitors the voltage 153 (Vv) across a first circuit path including a first series connection of the switch Q6 and the shunt resistor RS via the signal 153 received from the amplifier 113. As previously discussed, the voltage between Vw and the ground reference voltage at node NGND is generated based on current 121-3 supplied from or through the winding 131-3 of the motor 131.

The controller 140 produces a first sample (SW) of the first voltage at time TS2 during a first condition (between T14 and T15) in which the switch Q6 and the switch Q4 and switch Q2 are activated to an ON-state; current through the shunt resistor RS is zero during this condition.

The controller 140 produces a second sample (SW1) of the voltage 153 at TS1 in window of time between T12 to T13 during a condition in which the switch Q6 is activated to the ON-state; other switches Q2 and Q4 are OFF.

The controller 140 produces a second sample (SW2) of the voltage 153 at time TS3 in window of time T16 to T17 during a condition in which the switch Q6 is activated to the ON-state; other switches Q2 and Q4 are OFF.

The controller 140 receives a resistance of the shunt resistor Rs and according to the above equations determines the ON-resistance Rw of the switch based on the sample (SW), the sample (SW1), the sample (SW2), and the resistance of the shunt resistor. The ON-resistance Rw of the switch is equal to Rw:

where a resistance of the shunt resistor is RS; and $$SW'=(SW1+SW2)*0.5; \text{ and}$$

$$Rw=SW*RS/(SW'-SW).$$

In a similar manner, the controller 140 can be configured to determine an ON-resistance of each of the switches in the inverter 170 in different sectors.

Note further that, after determining the magnitude of the ON-resistance of each switch, the controller 140 can measure any of the currents through the respective windings of the motor.

For example, to measure the current through the winding 131-1, the controller 140 can be configured to activate the switch Q2 to an ON-state and deactivate switches Q4 and Q6 to OFF-states. The controller 140 receives a sample of the voltage Vu (a.k.a., signal 151) from the amplifier 111. To determine the current through winding 131-1, the controller 140 divides the voltage Vu by the resistance (RS+Ru), where RS is the resistance of resistor Rs and Ru is the determined ON-resistance of switch Q2.

To measure the current through the winding 131-2, the controller 140 can be configured to activate the switch Q4 to an ON-state and deactivate switches Q2 and Q6 to OFF-states. The controller 140 receives a sample of the voltage Vv (signal 152) from the amplifier 112. To determine the current through winding 131-2, the controller 140 divides the voltage Vv by the resistance (RS+Rv), where RS is the resistance of resistor Rs and Rv is the determined ON-resistance of switch Q4.

To measure the current through the winding 131-3, the controller 140 can be configured to activate the switch Q6 to an ON-state and deactivate switches Q2 and Q4 to OFF-states. The controller 140 receives a sample of the voltage Vw (signal 153) from the amplifier 113. To determine the current through winding 131-3, the controller 140 divides the voltage Vw by the resistance (RS+Rw), where Rs is the resistance of resistor Rs and Rw is the determined ON-resistance of switch Q6.

The controller 140 uses the calculated measurements of current 121-1 through winding 131-1, current 121-2 through winding 131-2, current 121-3 through winding 131-3, to control the signals QHU, QLU, QHU, QLU, QHU, and QLU, and corresponding switches Q1, Q2, Q3, Q4, Q5, and Q6 such that the shaft of the motor spins at a desired rate in accordance with the input 105. Again, the controller 140 can be configured to take preventive measures such as reduce or adjust currents through the windings if the determined temperature of one or more of Ru, Rv, and RW is above a threshold level.

Of course, the magnitude of the ON-resistance of each switch may change over time. For each sector, the controller 140 can be configured to repeatedly measure the ON-resistance of switches so that the controller 140 can measure a respective current through a winding based on the voltage as measured by each amplifier and total resistance of shunt resistor Rs plus the known ON-resistance as indicated above.

FIG. 3 is an example diagram illustrating voltage sampling and determination of an ON-resistance of a switch as discussed herein.

In this example, the timing diagram 300 indicates states of respective switches of the inverter 170 during different portions of a pulse width modulation cycle. The time between T21 and time T28 is one pulse width modulation cycle.

PWMu indicates states of controlling switches Q1 and Q2. For example, a high state of PWMu indicates the switch Q1 is ON and switch Q2 is OFF; a low state of PWMu indicates that the switch Q1 is OFF and switch Q2 is ON.

PWMv indicates states of controlling switches Q3 and Q4. A high state of PWMv indicates the switch Q3 is ON and switch Q4 is OFF; a low state of PWMv indicates that the switch Q3 is OFF and switch Q4 is ON.

PWMw indicates states of controlling switches Q5 and Q6. A high state of PWMw indicates that the switch Q5 is ON and switch Q6 is OFF; a low state of PWMw indicates that the switch Q5 is OFF and switch Q6 is ON.

Thus, as shown, between time T21 and time T22 (sequence 111), as indicated by signals PWMu, PWMv, and PWMw, the controller 170 activates switches Q1, Q3, and Q5 to an on state while deactivating switches Q2, Q4, and Q6 to an OFF-state.

Between time T22 and time T23 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T23 and time T24 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T24 and time T25 (sequence 000), as indicated by signals PWMu, PWMv, and PWMw, the controller 170 activates switches Q2, Q4, and Q6 to an ON state while deactivating switches Q1, Q3, and Q5 to an OFF-state.

Between time T25 and time T26 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T26 and time T27 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T27 and time T28 (sequence 111), as indicated by signals PWMu, PWMv, and PWMw, the controller 170 activates switches Q1, Q3, and Q5 to an on state while deactivating switches Q2, Q4, and Q6 to an OFF-state.

As further discussed herein, the controller 140 performs several measurements in one or more pulse width modulation control cycles of a sector to determine the magnitude of the Rds(ON) of switches Q4 and Q6.

For example, to determine the ON-resistance of the switch Q2, the controller 140 monitors a magnitude of the voltage signal 151 representing a magnitude of the voltage Vu across the circuit path between node NU and node NGND to produce sample SU. To determine the ON-resistance of the switch Q2, the controller 140 also monitors a magnitude of the voltage signal 152 representing a magnitude of the voltage Vv across the circuit path between node NV and node NGND to produce sample SV1, SV, and SV2.

As below, the controller 140 uses the collected samples in the equations below to produce a value for Ru (i.e., the ON-resistance between source and drain node of switch Q2).

$SU=-Iu*Ru$, where $Ru$ is the ON-resistance of the switch $Q2=>>$ thus $Iu=-SU/Ru$, $Iu$ is used for motor control;

$SV=-Iv*Rv$, where $Rv$ is the ON-resistance of the switch $Q4=>>$ thus $Iv=-SV/Rv$, $Iv$ is used for motor control;

$SV'=-Iv*Rv+Iu*Rs=>>$ thus $SV'=SV+[-Su/Ru]*Rs;$ $SV'-SV=[Su/Ru]*Rs;$ $SV-SV'=-[Su/Ru]*Rs;$ $Ru=[SU*Rs]/(SV'-SV).$ $Iu+Iv+Iw=0$ for motor control$=>>$ $Iu=-Iv-Iw$, where $Iv$ and $Iw$ are known from above equations.

$SU=-Iu*Ru$ $SV'=(SV1+SV2)*0.5=-Iv*Rv+Iu*Rs$ $SV=-Iv*Rv$ $Iu=-SU/Ru$ $Iv=-SV/Rv$ $Iw=-Iu-Iv$ $Ru=[SU*Rs]/(SV'-SV)$, where $Ru$ is Rds ON of the switch $Q2$.

In this example, the controller 140 monitors voltage 151 across a circuit path including a second series connection of a switch Q2 and the shunt resistor Rs; the voltage 151 is generated based on current 121-1 supplied from a winding 131-1 of the motor 131. The controller 140 monitors a voltage 152 across a second circuit path including a second series connection of switch Q4 and the shunt resistor Rs. The voltage 152 is generated based on current 121-2 supplied from winding 131-2 of the motor 131. The controller 140 determines the ON-resistance of the switch Q2 based on the monitored voltage 151 and the monitored voltage 152 as further discussed herein.

For example, the controller 140 produces a first sample (SU) of the voltage 151 during a first condition at time TS5 in which both the switch Q2 and the switch Q4 are activated to an ON-state between T24 and T25.

The controller 140 produce a second sample (SV) of the voltage 152 at time TS5 in which both the switch Q2 and the switch Q4 are activated to the ON-state.

The controller 140 produces a third sample (SV1) of the voltage 152 during a second condition at time TS4 in which the switch Q2 is deactivated to an OFF-state and the Q4 is activated to an ON-state.

The controller produces a fourth sample (SV2) of the voltage 152 during a second condition at time TS5 in which the switch Q2 is deactivated to an OFF-state and the switch Q4 is activated to an ON-state.

The controller 140 determines the ON-resistance of the switch Q2 based on the first sample (SU), the second sample (SV), the third sample (SV1), the fourth sample (SV2) and a resistance RS of the shunt resistor Rs.

As previously discussed, a magnitude of current through the shunt resistor Rs is substantially zero between time T24 and time T25. The magnitude of current through the shunt resistor Rs is substantially non-zero during the window of time between T23 and T24 and the window of time between T25 and T26.

Using the generated sample information, the controller 140 determines the ON-resistance Ru of the switch Q2 as follows:

a resistance of the shunt resistor is Rs;

$SV'=(SV1+SV2)*0.5;$ and $Ru=SU*RS/(SV-SV').$

In a similar manner, the controller 140 can be configured to determine an ON-resistance of each of the switches in the inverter 170 in different sectors.

Note further that, after determining the magnitude of the ON-resistance of each switch, the controller 140 can measure any of the currents through the respective windings of the motor.

Of course, the magnitude of the ON-resistance of each switch may change over time. For each sector, the controller 140 can be configured to repeatedly measure the ON-resistance of switches so that the controller 140 can measure a respective current through a winding based on the voltage as measured by each amplifier and total resistance of shunt resistor Rs plus the known ON-resistance as indicated above.

Note that the pulse width modulation cycle in FIG. 3 may be the same pulse width modulation cycle in FIG. 2 or the same pulse width modulation cycle in FIG. 4 below.

FIG. 4 is an example diagram illustrating voltage sampling and determination of an ON-resistance of a first switch and a second switch as discussed herein.

In this example, the timing diagram 400 indicates states of respective switches of the inverter 170 during different portions of a pulse width modulation cycle. The time between T31 and time T38 is one pulse width modulation cycle.

PWMu indicates states of controlling switches Q1 and Q2. For example, a high state of PWMu indicates the switch Q1 is ON and switch Q2 is OFF; a low state of PWMu indicates that the switch Q1 is OFF and switch Q2 is ON.

PWMv indicates states of controlling switches Q3 and Q4. A high state of PWMv indicates the switch Q3 is ON and switch Q4 is OFF; a low state of PWMv indicates that the switch Q3 is OFF and switch Q4 is ON.

PWMw indicates states of controlling switches Q5 and Q6. A high state of PWMw indicates that the switch Q5 is ON and switch Q6 is OFF; a low state of PWMw indicates that the switch Q5 is OFF and switch Q6 is ON.

Thus, as shown, between time T31 and time T32 (sequence 111), as indicated by signals PWMu, PWMv, and PWMw, the controller 170 activates switches Q1, Q3, and Q5 to an on state while deactivating switches Q2, Q4, and Q6 to an OFF-state.

Between time T32 and time T33 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T33 and time T34 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T34 and time T35 (sequence 000), as indicated by signals PWMu, PWMv, and PWMw, the controller 170 activates switches Q2, Q4, and Q6 to an ON state while deactivating switches Q1, Q3, and Q5 to an OFF-state.

Between time T35 and time T36 (sequence 100), as indicated by signals PWMu, PWMv, and PWMw, the controller 170 activates switches Q1, Q4, and Q6 to an ON state while deactivating switches Q2, Q3, and Q5 to an OFF-state.

Between time T36 and time T37 (sequence 110), as indicated by signals PWMu, PWMv, and PWMw, the controller 170 activates switches Q1, Q3, and Q6 to an on state while deactivating switches Q2, Q4, and Q5 to an OFF-state.

Between time T37 and time T38 (sequence 111), as indicated by signals PWMu, PWMv, and PWMw, the controller 170 activates switches Q1, Q3, and Q5 to an on state while deactivating switches Q2, Q4, and Q6 to an OFF-state.

As further discussed herein, the controller 140 performs several measurements in one or more pulse width modulation control cycles of a sector to determine the magnitude of the Rds(ON) of switches Q2 and Q6.

For example, to determine the ON-resistance of the switch Q2, the controller 140 monitors a magnitude of the voltage signal 151 representing a magnitude of the voltage Vu across the circuit path between node NU and node NGND to produce sample SU. To further determine the ON-resistance of the switch Q2, the controller 140 also monitors a magnitude of the voltage signal 153 representing a magnitude of the voltage Vw across the circuit path between node NW and node NGND to produce sample SW1, SW2, SW, SW3, and SW4.

As below, the controller 140 uses the collected samples in the equations below to produce a value for Ru (i.e., the ON-resistance between source and drain node of switch Q2) and for Rw (i.e., the ON-resistance between source and drain node of switch Q6).

$SU=-Iu*Ru$, where $Ru$ is the ON-resistance of the switch $Q2=>>$ thus $Iu=-SU/Ru$, $Iu$ is used for motor control;

$SW=-Iw*Rw$, where $Rw$ is the ON-resistance of the switch $Q6=>>$ thus $Iw=-SW/Rw$, $Iw$ is used for motor control;

$SW'=-Iw*Rw+Iu*Rs=>>$ thus $SW'=SW+[-Su/Ru]*Rs;$ $SW'-SW=-[Su/Ru]*Rs;$ $SW-SW'=-[Su/Ru]*Rs;$ $Ru=[SU*Rs]/(SW'-SW).$ $SW'''=-Iw*Rw+Iu*Rs=>>$ thus $SW'''=[SW/Rw]*Rw+[SW/Rw]*Rs;$ $SW'''=SW+[SW/Rw]*Rs;$ $SW'''-SW=[SW/Rw]*Rs;$ $Rw=[SW*Rs]/[SW'''-SW]$ $Iu+Iv+Iw=0$ for motor control$=>>$ $Iu=-Iv-Iw$, where $Iv$ and $Iw$ are known from above equations.

$SU=-Iu*Ru$ $SW=(SW1+SW4)*0.5=-Iw*Rw+Iu*Rs$ $SW'=(SW2+SW3)*0.5=-Iw*Rw-Iu*Rs$ $SW=-Iw*Rw$ $Iu=-SU/Ru$ $Iv=-Iu-Iw$ $Iw=-SW/Rw$ $Rw=[SW*Rs]/(SW'''-SW)$, where $Rw$ is $Rds$ ON of the switch $Q6$.

$Ru=[SU*Rs]/(SW-SW')$, where $Ru$ is $Rds$ ON of the switch $Q2$.

To determine the ON-resistance of switch Q2, the controller monitors voltage 151 across a circuit path including a series connection of switch Q2 and the shunt resistor Rs. The voltage 151 is generated based on current 121-1 supplied from a winding 131-1 of the motor 131. The controller monitors voltage 153 across a circuit path including series connection of a switch Q6 and the shunt resistor Rs. The voltage 153 is generated based on current 121-3 supplied from a winding 131-3 of the motor.

The controller 140 produces a first sample (SU) of the voltage 151 during a first condition at time TS9 in which both the switch Q2 and the switch Q6 are activated to an ON-state.

The controller 140 produces sample (SW) of the voltage 153 during the first condition in which both the switch Q2 and the switch Q6 are activated to the ON-state during window of time between T34 and T35.

The controller 140 produces a sample (SW1) of the voltage 153 during a second condition at time TS7 in which the switch Q2 is deactivated to an OFF-state and the switch Q6 is activated to an ON-state.

The controller 140 produces a third sample (SW4) of the voltage 153 during the second condition around time TS11 in which the switch Q2 is deactivated to an OFF-state and the switch Q6 is activated to an ON-state.

The controller determines the ON-resistance Ru of the switch Q2 based on the first sample (SU), the second sample (SW), the third sample (SW1), and the fourth sample (SW4), and a resistance RS of the shunt resistor Rs as follows:

a resistance of the shunt resistor is RS;

$SW'=(SW1+SW4)*0.5;$ and $Ru=SU*RS/(SW-SW').$

The controller 140 receives a resistance RS of the shunt resistor Rs and according to the above equations determines the ON-resistance Rw of the switch based on the sample (SW), the sample (SW1), the sample (SW4), and the resistance RS of the shunt resistor Rs. The ON-resistance Rw of the switch is equal to Rw:

where a resistance of the shunt resistor is RS; and $$SW'=(SW1+SW4)*0.5; \text{ and}$$

$$Rw=SW'*RS/(SW''-SW').$$

Figure 5:
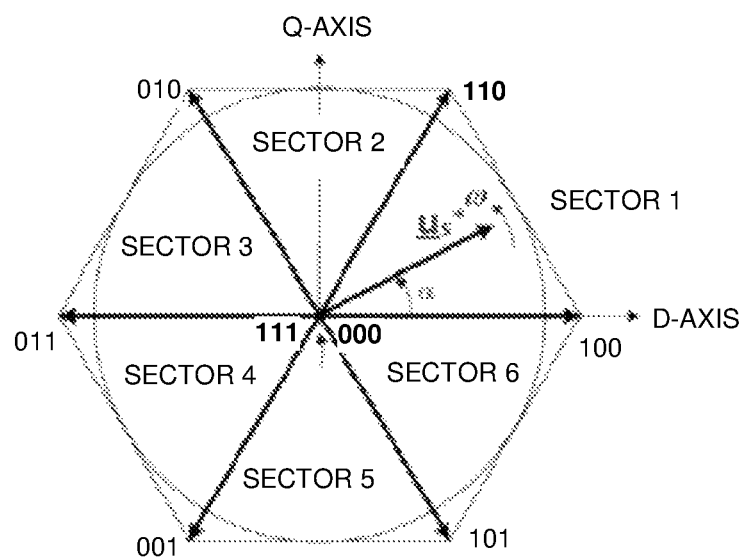
FIG. 5 is an example diagram illustrating different sectors of controlling a motor as discussed herein.

FIG. 5 is an example diagram illustrating different sectors of controlling a motor in different sectors as discussed herein.

Figure 6:
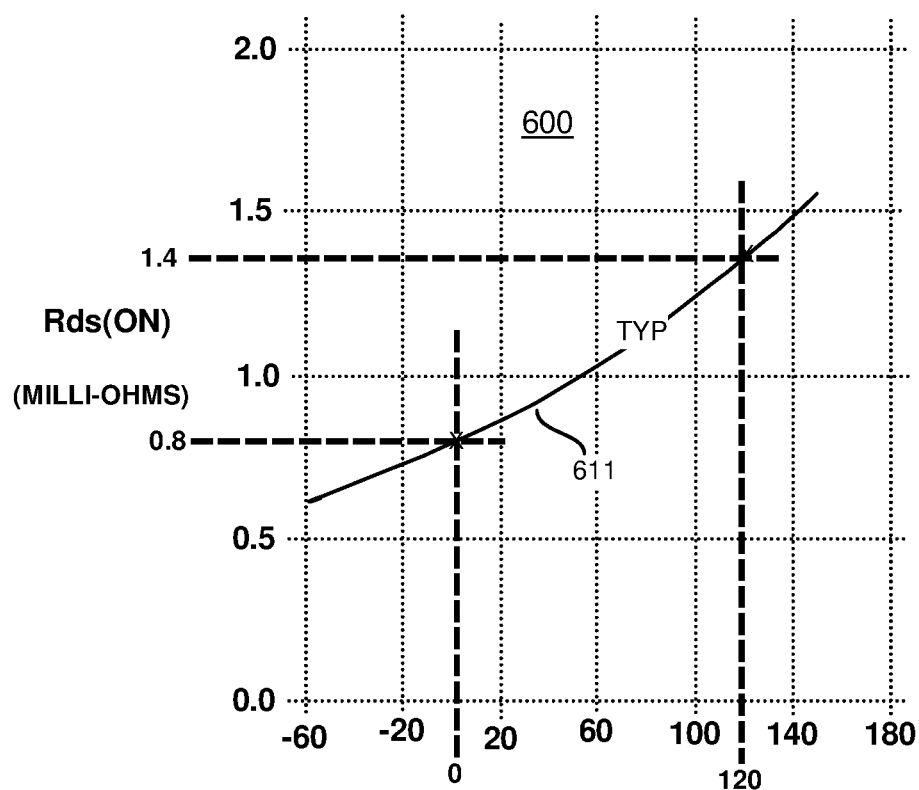
FIG. 6 is an example diagram illustrating a mapping of different Rds(ON) values to temperature as discussed herein.

FIG. 6 is an example diagram illustrating a mapping of different Rds(ON) values to temperature as discussed herein.

In this example, the graph 600 includes curve 611 indicating a relationship between the Rds(ON) resistance of a respective switch (any of switches Q2, Q4, and Q6) and temperature of the switch and/or drain-source junction.

Assume that the controller 140 determines that the Rds (ON) [such as one Ru, Rv, or Rw] is equal to 1.4 milliohms. In such an instance, the controller 140 uses the curve 611 of graph 600 to map the value 1.4 milliohms to the temperature of 120 degree Celsius.

The controller 140 can be proactive about adjusting the amount of current supplied through to the windings and switches based on the determined temperature of each of the switches in order to protect them. For example, assume that the controller 140 detects that one or more of the switches is operating at a temperature of 120 degrees Celsius as previously discussed. In such an instance, the controller 140 can be proactive about reducing the amount of current through each of the one or more windings of the motor 131 and corresponding switches in the inverter 170 so that they are not damaged the exposure to excessive heat.

As another example, assume that the controller determines that the Rds(ON) [such as one Ru, Rv, or Rw] is equal to 0.9 milliohms. In such an instance, the controller 140 uses the curve 611 of graph 600 to map the value 0.9 milliohms to the temperature of around 0 degree Celsius.

In this case, the controller 140 can be configured to prevent adjusting the amount of current supplied through to the windings based on the determined temperature of each of the switches if there is no danger of damage. For example, assume that the controller 140 detects that one or more of the switches is operating at a temperature of 0 degrees Celsius as previously discussed. In such an instance, there is no need for the controller 140 to reduce current through the windings of the motor 130 because the switches are not in danger of being damaged at this low temperature.

Figure 7:
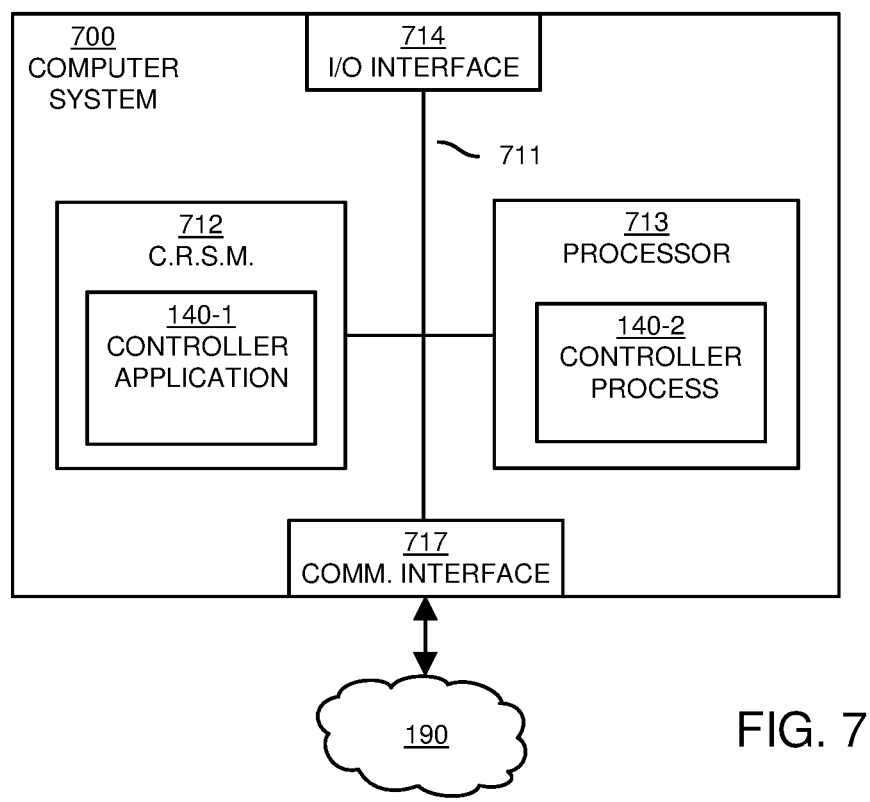
FIG. 7 is an example diagram illustrating computer processor hardware and related software instructions that execute methods as discussed herein.

FIG. 7 is an example block diagram of a computer device for implementing any of the operations and methods as discussed herein.

As shown, computer system 700 (such as implemented by any of one or more resources such as controller 140, etc.) of the present example includes an interconnect 711 that couples computer readable storage media 712 such as a non-transitory type of media (or hardware storage media) in which digital information can be stored and retrieved, a processor 713 (e.g., computer processor hardware such as one or more processor devices), I/O interface 714, and a communications interface 717.

I/O interface 714 provides connectivity to any suitable circuitry or component such as amplifier 131, 132, 133, etc., to monitor voltage 151, 152, 153, etc.

Computer readable storage medium 712 can be any hardware storage resource or device such as memory, optical storage, hard drive, floppy disk, etc. In one example, the computer readable storage medium 712 stores instructions and/or data used by the controller application 140-1 to perform any of the operations as described herein.

Further in this example, communications interface 717 enables the computer system 700 and processor 713 to communicate over a resource such as network 190 to retrieve information from remote sources and communicate with other computers.

As shown, computer readable storage media 712 is encoded with controller application 140-1 (e.g., software, firmware, etc.) executed by processor 713. Controller application 140-1 can be configured to include instructions to implement any of the operations as discussed herein.

During operation of one example, processor 713 accesses computer readable storage media 712 via the use of interconnect 711 in order to launch, run, execute, interpret or otherwise perform the instructions in controller application 140-1 stored on computer readable storage medium 712.

Execution of the controller application 140-1 produces processing functionality such as controller process 140-2 in processor 713. In other words, the controller process 140-2 associated with processor 713 represents one or more aspects of executing controller application 140-1 within or upon the processor 713 in the computer system 700.

In accordance with different examples, note that computer system 700 can be a micro-controller device, logic, hardware processor, hybrid analog/digital circuitry, etc., configured to control a power supply and perform any of the operations as described herein.

Functionality supported by the different resources will now be discussed via flowchart 800 in FIG. 8 and flowchart 900 in FIG. 9. Note that the steps in the flowcharts below can be executed in any suitable order.

Figure 8:
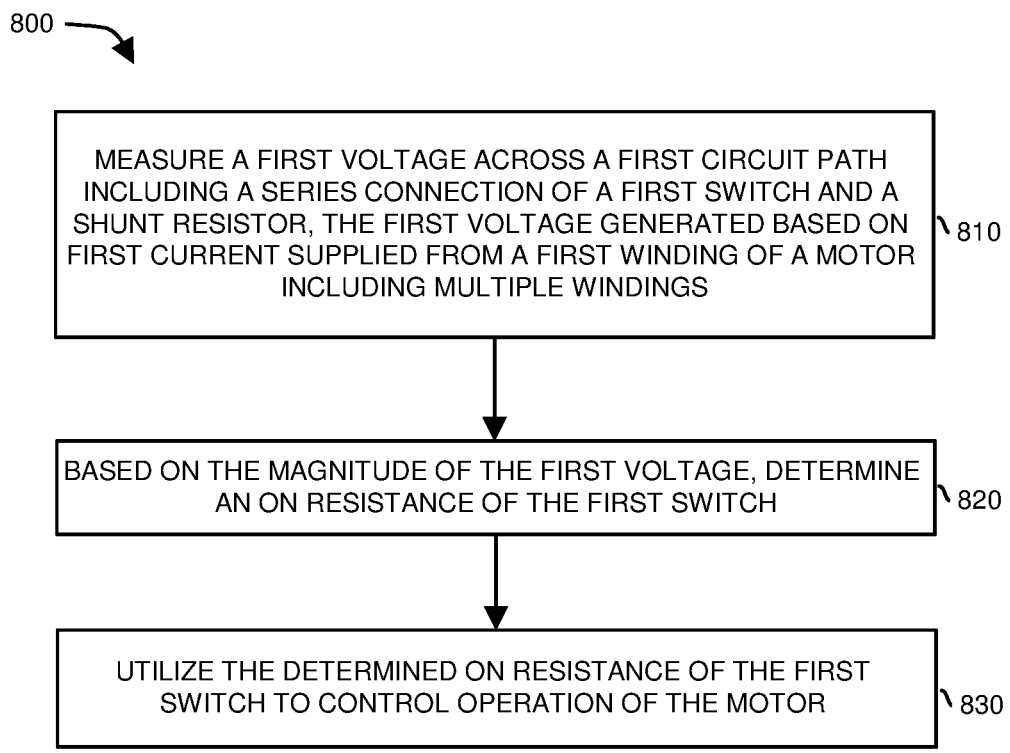
FIG. 8 is an example diagram illustrating a method as discussed herein.

FIG. 8 is an example diagram illustrating a method of determining an ON-resistance of a switch as discussed herein.

In processing operation 810 of flowchart 800, the controller 140 monitors a first voltage across a first circuit path including a series connection of a first switch and a shunt resistor. The first voltage is generated based on first current supplied from a first winding of a motor including multiple windings.

In processing operation 820, based on sample magnitudes of the first voltage, the controller 140 determines an ON-resistance of the first switch.

In processing operation 830, the controller 140 utilizes the determined ON-resistance of the first switch to control operation of the motor 131.

Figure 9:
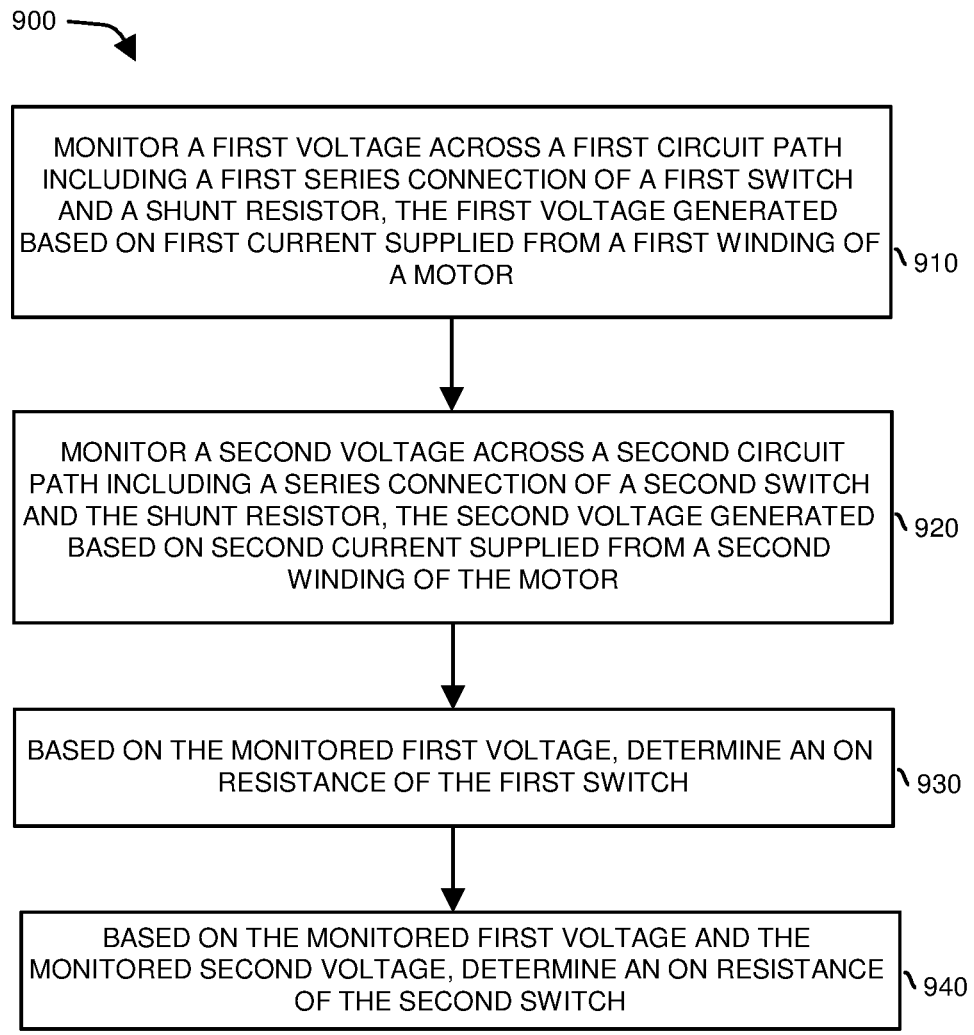
FIG. 9 is an example diagram illustrating a method as discussed herein.

FIG. 9 is an example diagram illustrating a method of determining an ON-resistance of multiple switches as discussed herein.

In processing operation 910 of flowchart 900, the controller 140 monitors a first voltage across a first circuit path including a first series connection of a first switch and a shunt resistor. The first voltage is generated based on first current supplied from a first winding of a motor.

In processing operation 920, the controller 140 monitors a second voltage across a second circuit path including a series connection of a second switch and the shunt resistor. The second voltage is generated based on second current supplied from a second winding of the motor.

In processing operation 930, based on samples of the monitored first voltage, the controller determines an ON-resistance of the first switch.

In processing operation 940, based on first one or more samples of the monitored first voltage and second one or more samples of the monitored second voltage, the controller determines an ON-resistance of the second switch.

Note again that techniques herein are well suited for use in circuit applications such as those that implement more precise current monitoring and control. However, it should be noted that examples herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred examples thereof, it will be understood by those skilled in the art that various changes in form and details may be made therein without departing from the spirit and scope of the present application as defined by the appended claims. Such variations are intended to be covered by the scope of this present application. As such, the foregoing description of examples of the present application is not intended to be limiting. Rather, any limitations to the invention are presented in the following claims.

The invention claimed is:

1. An apparatus comprising:
   a controller operative to:
   monitor a first voltage across a first circuit path including a series connection of a first switch and a shunt resistor, the first voltage across the first circuit path generated based on first current supplied from a first winding of a motor through the first circuit path; and
   based on the monitored first voltage, determine an ON-resistance of the first switch.

2. The apparatus as in claim 1, wherein the controller is further operative to:
   monitor a second voltage across a second circuit path including a series connection of a second switch and the shunt resistor, the second voltage generated based on second current supplied from a second winding of the motor.

3. The apparatus as in claim 2, wherein the controller is further operative to:
   based on the monitored first voltage and the monitored second voltage, determine an ON-resistance of the second switch.

4. The apparatus as in claim 3, wherein the first winding and the second winding of the motor are connected in series.

5. The apparatus as in claim 1, wherein the controller is further operative to:
   utilize the determined ON-resistance of the first switch to control operation of the motor.

6. The apparatus as in claim 1, wherein the controller is further operative to:
   map a magnitude of the ON-resistance of the first switch to a temperature value indicative of a temperature of the first switch.

7. The apparatus as in claim 6, wherein the controller is further operative to control operation of the first switch based on the temperature of the first switch.

8. The apparatus as in claim 1, wherein the controller is further operative to:
   determine a magnitude of the first current through the first winding based on a sample magnitude of the first voltage across the first circuit path.

9. The apparatus as in claim 1, wherein the first switch is a low-side switch disposed in series with a high-side switch, the low-side switch operative to control current through the first winding.

10. The apparatus as in claim 1, wherein the first voltage is measured during a condition in which the first switch is set to an ON-state.

11. The apparatus as in claim 1, wherein the controller is further operative to:
    obtain a sample of a magnitude of the first voltage during a condition in which a magnitude of current through the shunt resistor is substantially zero; and
    determine the ON resistance of the first switch based on the sample.

12. The apparatus as in claim 1, wherein the first switch is a field effect transistor; and
    wherein the ON-resistance of the first switch is an RDS ON-resistance of the field effect transistor.

13. The apparatus as in claim 1, wherein the controller is further operative to:
    produce a first sample (SW) of the first voltage during a first condition in which the first switch is activated to an ON-state;
    produce a second sample (SW1) of the first voltage during a second condition in which the first switch is activated to the ON-state;
    receive a resistance of the shunt resistor; and
    determine the ON-resistance of the first switch based on the first sample (SW), the second sample (SW1), and the resistance of the shunt resistor.

14. The apparatus as in claim 13, wherein a magnitude of current through the shunt resistor is substantially zero during the first condition; and
    wherein the magnitude of current through the shunt resistor is substantially non-zero during the second condition.

15. The apparatus as in claim 1, wherein the controller is further operative to:

produce a first sample (SW) of the first voltage during a first condition in which the first switch is activated to an ON-state;
produce a second sample (SW1) of the first voltage during the first condition in which the first switch is activated to the ON-state;
produce a third sample (SW2) of the first voltage during the first condition in which the first switch is activated to the ON-state;
receive a resistance of the shunt resistor; and
determine the ON-resistance of the first switch based on the first sample (SW), the second sample (SW1), the third sample (SW2), and the resistance of the shunt resistor;
wherein the ON-resistance of the first switch is equal to Rw;
wherein a resistance of the shunt resistor is RS; and
wherein SW'=(SW1+SW2)*0.5; and
wherein Rw=SW*RS/(SW'−SW)*RS.

16. The apparatus as in claim 1, wherein the controller is further operative to:
monitor a second voltage across a second circuit path including a second series connection of a second switch and the shunt resistor, the second voltage generated based on second current supplied from a second winding of the motor; and
determine the ON-resistance of the first switch based on the monitored first voltage and the monitored second voltage.

17. The apparatus as in claim 16, wherein the controller is further operative to:
produce a first sample (SU) of the first voltage during a first condition in which both the first switch and the second switch are activated to an ON-state;
produce a second sample (SV) of the second voltage during the first condition in which both the first switch and the second switch are activated to the ON-state;
produce a third sample (SV1) of the second voltage during a second condition in which the first switch is deactivated to an OFF-state and the second switch is activated to an ON-state; and
produce a fourth sample (SV2) of the second voltage during a second condition in which the first switch is deactivated to an OFF-state and the second switch is activated to an ON-state; and
determine the ON-resistance of the first switch based on the first sample (SU), the second sample (SV), the third sample (SV1), the fourth sample (SV2) and a resistance of the shunt resistor.

18. The apparatus as in claim 17, wherein a magnitude of current through the shunt resistor is substantially zero during the first condition; and
wherein the magnitude of current through the shunt resistor is substantially non-zero during the second condition.

19. The apparatus as in claim 17, wherein the ON-resistance of the first switch is equal to Ru;
wherein a resistance of the shunt resistor is RS;
wherein SV'=(SV1+SV2)*0.5; and
wherein Ru=SU*RS/(SV'−SV).

20. The apparatus as in claim 1, wherein the controller is further operative to:
monitor a second voltage across a second circuit path including a second series connection of a second switch and the shunt resistor, the second voltage generated based on second current supplied from a second winding of the motor;
produce a first sample (SU) of the first voltage during a first condition in which both the first switch and the second switch are activated to an ON-state; and
produce a second sample (SW) of the second voltage during the first condition in which both the first switch and the second switch are activated to the ON-state;
produce a third sample (SW1) of the second voltage during a second condition in which the first switch is deactivated to an OFF-state and the second switch is activated to an ON-state;
produce a third sample (SW4) of the second voltage during the second condition in which the first switch is deactivated to an OFF-state and the second switch is activated to an ON-state; and
determine the ON-resistance of the second switch based on the first sample (SU), the second sample (SW), the third sample (SW1), and the fourth sample (SW4), and a resistance of the shunt resistor.

21. The apparatus as in claim 20, wherein the ON-resistance of the second switch is equal to Ru;
wherein a resistance of the shunt resistor is RS;
wherein SW'=(SW1+SW4)*0.5; and
wherein Ru=SU*RS/(SW'−SW).

22. A method comprising:
measuring a first voltage across a first circuit path including a series connection of a first switch and a shunt resistor, the first voltage generated based on first current supplied from a first winding of a motor including multiple windings;
based on the magnitude of the first voltage, determining an ON-resistance of the first switch; and
utilizing the determined ON-resistance of the first switch to control operation of the motor.

23. Computer-readable storage media having instructions stored thereon, the instructions, when executed by computer processor hardware, cause the computer processor hardware to:
measure a first voltage across a first circuit path including a series connection of a first switch and a shunt resistor, the first voltage generated based on first current supplied from a first winding of a motor including multiple windings;
based on the magnitude of the first voltage, determine an ON-resistance of the first switch; and
utilize the determined ON-resistance of the first switch to control operation of the motor.

* * * * *